(12) United States Patent
Chen et al.

(10) Patent No.: US 10,935,578 B1
(45) Date of Patent: Mar. 2, 2021

(54) ELECTRONIC APPARATUS, VOLTAGE DETECTOR AND VOLTAGE DETECTION METHOD THEREOF

(71) Applicants: LITE-ON ELECTRONICS (GUANGZHOU) LIMITED, Guangzhou (CN); Lite-On Technology Corporation, Taipei (TW)

(72) Inventors: Yen-Liang Chen, Taipei (TW); Yu-Ho Lin, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 16/662,039

(22) Filed: Oct. 24, 2019

(30) Foreign Application Priority Data

Aug. 28, 2019 (TW) .................. 108130778

(51) Int. Cl.
*H02M 7/06* (2006.01)
*G01R 19/165* (2006.01)

(52) U.S. Cl.
CPC . *G01R 19/16547* (2013.01); *G01R 19/16523* (2013.01); *H02M 7/06* (2013.01)

(58) Field of Classification Search
CPC ....... G01R 19/16547; G01R 19/16523; H02M 5/45; H02M 5/42; H02M 1/12; H02M 1/14; H02M 1/00; H02M 1/02; H02M 1/10; H02M 1/143; H02M 7/125; H02M 7/122; H02M 7/00; H02M 7/08; H02M 7/48; H02M 7/10; H02M 7/15; H02M 7/68; H02M 7/04; H02M 7/5383; H02M 2001/0045; H02M 2001/0048; H02M 2001/0051; H02M 2001/0058; H02M 2001/0054; H02M 3/24; H02M 3/06; H02M 3/135; H02M 3/137; H02M 3/145; H02M 3/155; H02M 3/156; H02M 3/158; H02M 3/1588; H02M 3/315; H02M 3/335;

(Continued)

(56) References Cited

U.S. PATENT DOCUMENTS 4,400,655 A * 8/1983 Curtiss ................... H02J 3/1892
318/729
4,469,997 A * 9/1984 Curtiss ................... H02J 3/1892
318/729

(Continued)

*Primary Examiner* — Thienvu V Tran
*Assistant Examiner* — Nusrat Quddus
(74) *Attorney, Agent, or Firm* — JCIPRNET

(57) ABSTRACT

An electronic apparatus, a voltage detector, and a voltage detection method thereof are provided. The voltage detector includes a rectifying and filtering circuit, a comparison circuit, and a detection signal generator. The rectifying and filtering circuit receives an alternating current input voltage and performs a rectifying and filtering operation on the alternating current input voltage to generate a processed voltage. The comparison circuit compares the processed voltage with a reference voltage to generate a comparison signal. The detection signal generator has a first side and a second side. The first side receives the comparison signal and generates an induction signal according to the comparison signal. The second side receives the indication signal to generate a detection signal. The first side and the second side are isolated.

19 Claims, 5 Drawing Sheets

(58) Field of Classification Search
CPC ......... H02M 3/33507; H02M 3/33523; H02M 3/33553; H02M 3/33569
See application file for complete search history.

(56) References Cited

U.S. PATENT DOCUMENTS

| | | | | | |
|---|---|---|---|---|---|
| 5,437,040 | A | * | 7/1995 | Campbell | G01R 31/40 307/22 |
| 5,519,289 | A | * | 5/1996 | Katyl | H05B 41/392 315/224 |
| 5,754,036 | A | * | 5/1998 | Walker | G05F 1/66 323/235 |
| 5,847,909 | A | * | 12/1998 | Hopkins | H02H 3/162 361/35 |
| 6,175,220 | B1 | * | 1/2001 | Billig | H05B 39/044 323/239 |
| 6,515,437 | B1 | * | 2/2003 | Zinkler | H05B 39/00 315/291 |
| 6,850,394 | B2 | * | 2/2005 | Kim | H02H 3/338 361/42 |
| 7,541,751 | B2 | * | 6/2009 | Vaziri | H05B 39/02 315/274 |
| 7,855,524 | B2 | * | 12/2010 | Pummer | H02J 3/1892 318/438 |
| 8,570,160 | B2 | * | 10/2013 | Speegle | H05B 47/185 340/12.32 |
| 10,170,975 | B1 | * | 1/2019 | Feng | H02J 3/24 |
| 2014/0167634 | A1 | * | 6/2014 | Ivankovic | H05B 45/10 315/210 |
| 2015/0194843 | A1 | * | 7/2015 | Singer | H05B 41/46 315/86 |
| 2017/0366090 | A1 | * | 12/2017 | Sugawara | H02M 3/33569 |

\* cited by examiner

ELECTRONIC APPARATUS, VOLTAGE DETECTOR AND VOLTAGE DETECTION METHOD THEREOF

CROSS-REFERENCE TO RELATED APPLICATION

This application claims the priority benefit of Taiwan application serial no. 108130778, filed on Aug. 28, 2019. The entirety of the above-mentioned patent application is hereby incorporated by reference herein and made a part of this specification.

BACKGROUND OF THE INVENTION

1. Field of the Invention

The present invention generally relates to an electronic apparatus, a voltage detector and a voltage detection method thereof, in particular, to a power supply unit of an electronic apparatus, a voltage detector therein and a voltage detection method thereof.

2. Description of Related Art

In an electronic apparatus, it is a very important issue to provide a stable power supply. In a switching type voltage converter in the known technical field, it is very important to arrange a filter capacitor with a large capacitance value. The filter capacitor is matched with a filtering circuit to generate a direct current voltage. In addition, the filter capacitor is also configured for providing the direct current voltage to execute a voltage converting operation and thus generating a supply voltage. When an input alternating current voltage is cut off power, due to an effect of the filter capacitor, the supply voltage is held to be kept in a stable state to continue for a period of time, and the time is called hold time.

During the hold time, the electronic apparatus performs a back-up storing operation of important data, or a switching operation of a redundant power source is performed. In order to provide long enough hold time, in the known art, it is completed by building a PFC converter (Power Factor Correction converter). However, the PFC converter needs to occupy a circuit area in an equivalently large size, and cost of the electronic apparatus is substantially increased.

SUMMARY OF THE INVENTION

Accordingly, the present invention is directed to an electronic apparatus, a voltage detector, and a voltage detection method thereof, and hold time of a power supply is prolonged.

The voltage detector of the present invention includes a rectifying and filtering circuit, a comparison circuit and a detection signal generator. The rectifying and filtering circuit receives an alternating current input voltage and performs a rectifying and filtering operation on the alternating current input voltage to generate a processed voltage. The comparison circuit is coupled to the rectifying and filtering circuit, and compares the processed voltage with a reference voltage to generate a comparison signal. The detection signal generator includes a first side and a second side. The first side is coupled to the comparison signal to receive the comparison signal. The first side generates an induction signal according to the comparison signal. The second side receives the indication signal to generate a detection signal. The first side and the second side are isolated.

The electronic apparatus of the present invention includes the voltage detector as mentioned above and a load device. The load device is coupled to the voltage detector. The load device receives the detection signal, and adjusts a power demand according to the detection signal.

The voltage detection method of the present invention includes the following steps. An alternating current input voltage is received, and a rectifying and filtering operation is performed on the alternating current input voltage to generate a processed voltage. The processed voltage is compared with a reference voltage to generate a comparison signal. A detection signal generator having a first side and a second side is provided. The comparison signal is received through the first side. An induction signal is generated according to the comparison signal. The induction signal is received through the second side to generate a detection signal. The first side and the second side are isolated.

Based on the above, the present invention performs detection on the alternating current input voltage, by means of the comparison circuit, on the first side of the detection signal generator, the processed voltage is compared with the reference voltage to generate the comparison signal, the detection signal is generated on the second side of the detection signal generator according to the comparison signal, and a power supply state of the alternating current input voltage is indicted by means of the detection signal. The first side and the second side are isolated.

In order to make the aforementioned and other objectives and advantages of the present invention comprehensible, embodiments accompanied with figures are described in detail below.

DESCRIPTION OF THE EMBODIMENTS

Figure 1:
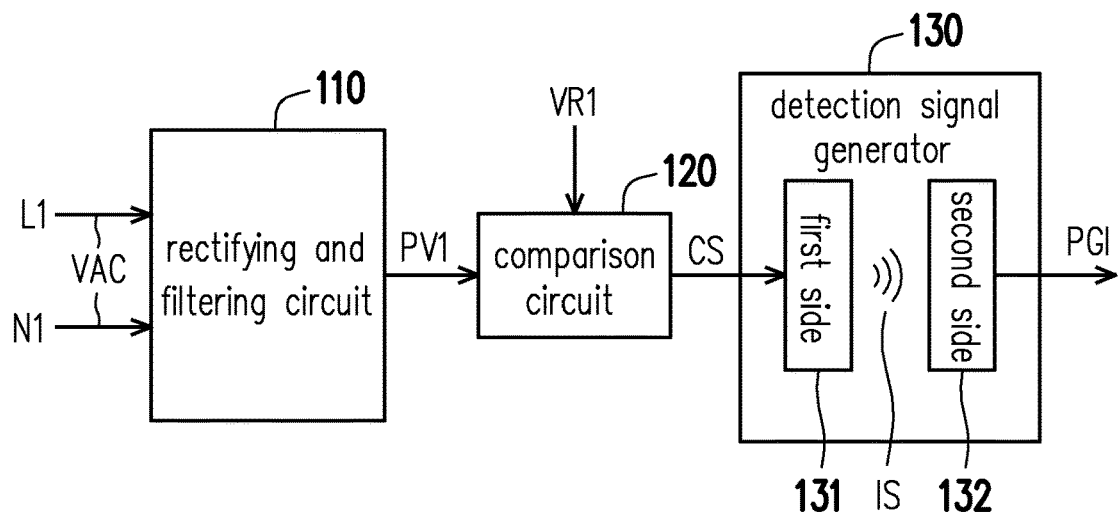
FIG. 1 is a schematic diagram of a voltage detector according to an embodiment of the present invention.

Referring to FIG. 1, FIG. 1 is a schematic diagram of a voltage detector according to an embodiment of the present invention. A voltage detector 100 includes a rectifying and filtering circuit 110, a comparison circuit 120 and a detection signal generator 130. The rectifying and filtering circuit 110 is coupled to a live wire end L1 and a neutral wire end N1, and receives an alternating current input voltage VAC through the live wire end L1 and the neutral wire end N1. The rectifying and filtering circuit 110 performs a rectifying and filtering operation on the alternating current input voltage VAC so as to generate a processed voltage PV1. The comparison circuit 120 is coupled to the rectifying and filtering circuit 110. The comparison circuit 120 compares the processed voltage PV1 with a reference voltage VR1 to generate a comparison signal CS. The detection signal generator 130 is coupled to the comparison circuit 120. The detection signal generator 130 includes a first side 131 and a second side 132 which are mutually coupled. The first side 131 is coupled to the comparison signal 120 so as to receive the comparison signal CS. The first side 131 generates an induction signal IS according to the comparison signal CS. The second side 132 receives the indication signal IS to generate a detection signal PGI. The first side 131 and the second side 132 are isolated, but are not in contact.

Speaking in detail, in the present embodiment, the alternating current input voltage VAC is used as a supply voltage of a load device. The voltage detector 100 generates the detection signal PGI by detecting a power supply state of the alternating current input voltage VAC. The rectifying and filtering circuit 110 receives the alternating current input voltage VAC, and performs a rectifying operation on the alternating current input voltage VAC so as to generate a quasi-direct current voltage, and the rectifying and filtering circuit 110 further performs filtering on the quasi-direct current voltage so as to generate the processed voltage PV1.

On the other hand, the comparison circuit 120 performs a comparing operation on the processed voltage PV1 and the reference voltage VR1, and determines whether the alternating current input voltage VAC is powered off or not by determining whether a voltage value of the processed voltage PV1 is higher than a voltage value of the reference voltage VR1 or not. When the processed voltage PV1 is less than the reference voltage VR1, the comparison circuit 120 generates the comparison signal CS indicating that the alternating current input voltage VAC is powered off. Relatively, when the processed voltage PV1 is not less than the reference voltage VR1, the comparison circuit 120 generates the comparison signal CS indicating that the alternating current input voltage VAC is not powered off.

In addition, the first side 131 of the detection signal generator 130 receives the comparison signal CS, and determines whether to generate the induction signal IS or not according to the comparison signal CS. Subsequent to the above illustration, when the comparison signal CS indicates that the alternating current input voltage VAC is not powered off, the first side 131 continuously generates the induction signal IS according to the comparison signal CS. In the meanwhile, the second side 132 of the detection signal generator 130 receives the induction signal IS, and generates the detection signal PGI according to a first condition for receiving the induction signal IS. Relatively, when the comparison signal CS indicates that the alternating current input voltage VAC is powered off, the first side 131 stops generating the induction signal IS according to the comparison signal CS. In the meanwhile, the second side 132 of the detection signal detector 130 generates the detection signal PGI under a condition without receiving the induction signal IS. It should be noted here that under the first condition and the second condition, voltage values of the detection signal PGI generated by the detection signal generator 130 are different.

It should be mentioned that the voltage detector 100 of the embodiments of the present invention performs a determining operation whether the alternating current input voltage VAC is powered off or not through the first side 131 of the detection signal generator 130, and generates the detection signal PGI through the second side 132 isolated from the first side 131, and then the detection signal PGI is provided for the load device (not shown). Thus, the load device does not affect the determining operation whether the alternating current input voltage VAC is powered off or not, and guarantees correctness of the detection signal PGI. In addition, through the detection signal PGI, the load device properly adjusts power demand thereof, and effectively executes load shedding, data backup or a switching operation of redundant power under the condition that the alternating current input voltage VAC is powered off.

Figure 2:
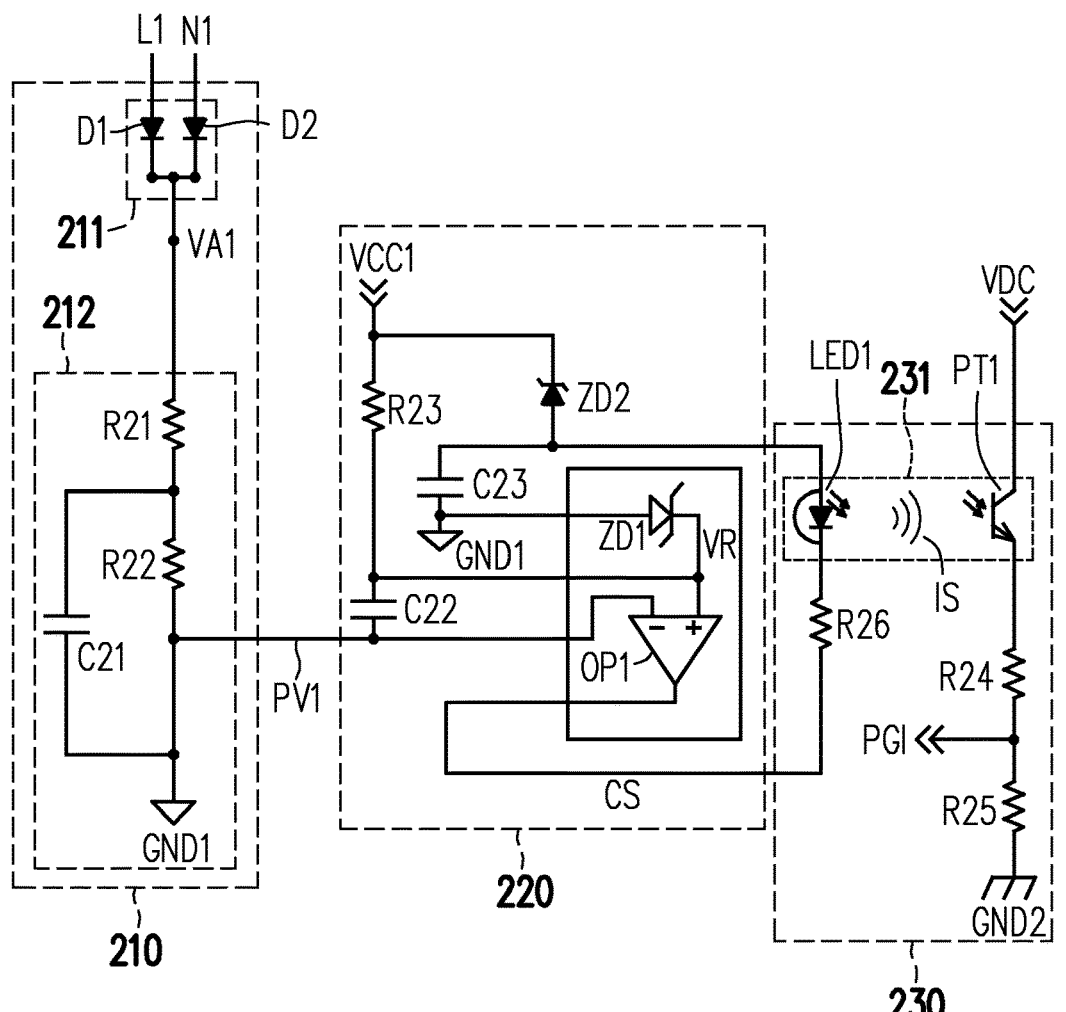
FIG. 2 is a circuit schematic diagram of a voltage detector according to another embodiment of the present invention.

Referring to FIG. 2 below, FIG. 2 is a circuit schematic diagram of a voltage detector according to another embodiment of the present invention. A voltage detector 200 includes a rectifying and filtering circuit 210, a comparison circuit 220 and a detection signal generator 230. The rectifying and filtering circuit 210 includes a rectifying circuit 211 and a filtering circuit 212. The rectifying circuit 211 is coupled to a live wire end L1 and a neutral wire end N1 to receive an alternating current input voltage. The rectifying circuit 211 includes diodes D1 and D2. In the present embodiment, anodes of the diodes D1 and D2 are respectively coupled to the live wire end L1 and the neutral wire end N1, and cathodes of the diodes D1 and D2 are coupled to each other and coupled to the filtering circuit 212. The rectifying circuit 211 is configured for performing rectifying on the alternating current input voltage, and generates a quasi-direct current voltage VA1.

The filtering circuit 212 is coupled to the rectifying circuit 211 and receives the quasi-direct current voltage VA1. In the present embodiment, the filtering circuit 212 includes resistors R21 and R22 and a capacitor C21. A first end of the resistor R21 receives the quasi-direct current voltage VAL and a second end of the resistor R21 is coupled to a first end of the resistor R22, and a second end of the resistor R22 is coupled to a reference grounding voltage end GND1. Besides, the capacitor C21 is coupled between the second end of the resistor R21 and the reference grounding voltage end GND1. The resistors R21 and R22 and the capacitor C21 form a low-pass filter to be configured for performing a low-pass filtering operation on the quasi-direct current voltage VA1 so as to generate a processed voltage PV1.

The comparison circuit 220 is coupled to the rectifying and filtering circuit 210, and receives the processed voltage PV1. In the present embodiment, the comparison circuit 220 includes an operational amplifier OP1, Zener diodes ZD1 and ZD2, a resistor R23 and capacitors C22 and C23. The operational amplifier OP1 includes a positive input end to be coupled to a cathode of the Zener diode ZD1, and further includes a negative input end to receive the processed voltage PV1. In addition, an anode of the Zener diode ZD1 is coupled to the reference grounding voltage end GND1, and the cathode of the Zener diode ZD1 receives a power voltage VCC1 through the resistor R23. Herein, the resistor R23 and the Zener diode ZD1 form a reference voltage generator, and provide a reference voltage VR to the positive input end of the operational amplifier OP1. In the present embodiment, the reference voltage is substantially equal to a breakdown voltage of the Zener diode ZD1.

In the present embodiment, the operational amplifier OP1 serves as a voltage comparator, and compares the reference voltage VR with the processed voltage PV1. When the reference voltage VR is greater than the processed voltage PV1, an output end of the operational amplifier OP1 generates a comparison signal CS with a relatively high voltage (determined according to a voltage value of an operating voltage received by the operational amplifier OP1). Relatively, when the reference voltage VR is not greater than the processed voltage PV1, the output end of the operational amplifier OP1 generates a comparison signal CS with a relatively low voltage (for example, equal to a first reference grounding voltage on the first reference grounding voltage end GND1).

It should be mentioned incidentally that in the present embodiment, the capacitor C23 is coupled between the reference grounding voltage end GND1 and the positive input end of the operational amplifier OP1, and is used as a voltage stabilizing capacitor. The Zener diode ZD2 and the capacitor C23 are connected between the power voltage VCC1 and the reference grounding voltage end GND1 in series in sequence. A cathode of the Zener diode ZD2 receives the power voltage VCC1, an anode of the Zener diode ZD2 is coupled to the capacitor C23, and is coupled to the detection signal generator 230.

The detection signal generator 230 includes an optical coupler 231 and resistors R24, R25 and R26. The optical coupler 231 includes a light-emitting element LED1 and a phototransistor PT1. The light-emitting element LED1 is a light-emitting diode. In FIG. 2, the light-emitting element LED1 and the resistor R26 form a first side of the detection signal generator 230, and the phototransistor PT1 and the resistors R24 and R25 form a second side of the detection signal generator 230. In a connection relationship, one end (anode) of the light-emitting element LED1 is coupled to the anode of the Zener diode ZD2 to be coupled to the power voltage VCC1 through the Zener diode ZD2. The other end (cathode) of the light-emitting element LED1 receives the comparison signal CS through the resistor R26. On the other hand, one end of the phototransistor PT1 receives the power voltage VCC, and the other end of the phototransistor PT1 is coupled to the resistor R24. The resistors R24 and R25 are connected between the phototransistor PT1 and a reference grounding voltage end GND2 in series in sequence. Coupled end points of the resistors R24 and R25 provide a detection signal PGI.

It should be noted that the light-emitting element LED1 is configured for generating an optics induction signal IS, and a control end of the phototransistor PT1 is configured for receiving the induction signal IS. The phototransistor PT1 is turned on when the control end thereof receives the induction signal IS of enough energy. Relatively, if the control end of the phototransistor PT1 does not receive the induction signal IS of enough energy, the phototransistor PT1 is in a turning-off state.

It should be mentioned that based on that the first side and the second side of the detection signal generator 230 are isolated, the reference grounding voltage ends GND1 and GND2 shown in FIG. 2 are different.

In the aspect of an operation, when the comparison signal CS has a relatively low voltage value (equal to a first reference grounding voltage), the light-emitting element LED1 is turned on so as to generate the induction signal IS of optical energy. In the meanwhile, the phototransistor PT1 is turned on based on the received induction signal IS. Accordingly, the second side of the detection signal generator 230 generates the detection signal PGI for a first voltage, a voltage value of the first voltage is determined according to resistance values of the resistors R24 and R25, and the voltage value of the first voltage is greater than a second reference grounding voltage on the second reference grounding voltage end GND2.

On the other hand, when the comparison signal CS has a relatively high voltage value, the light-emitting element LED1 is turned off and does not generate the induction signal IS. In the meanwhile, the phototransistor PT1 is turned off under a condition without receiving the induction signal IS of enough energy. Accordingly, the second side of the detection signal generator 230 generates the detection signal PGI equal to the second reference grounding voltage.

It should be mentioned that the detection signal PGI is provided to the load device. The load device receives a supply voltage generated according to the alternating current input voltage to operate. The load device acquires whether the alternating current voltage is powered off or not according to an amplitude of the voltage value of the detection signal PGI, and accordingly adjusts the powder demand thereof. Specifically speaking, when the load device detects that the detection signal PGI is equal to the second reference grounding voltage, a load shedding operation is performed, and the hold time is effectively prolonged.

Figure 3:
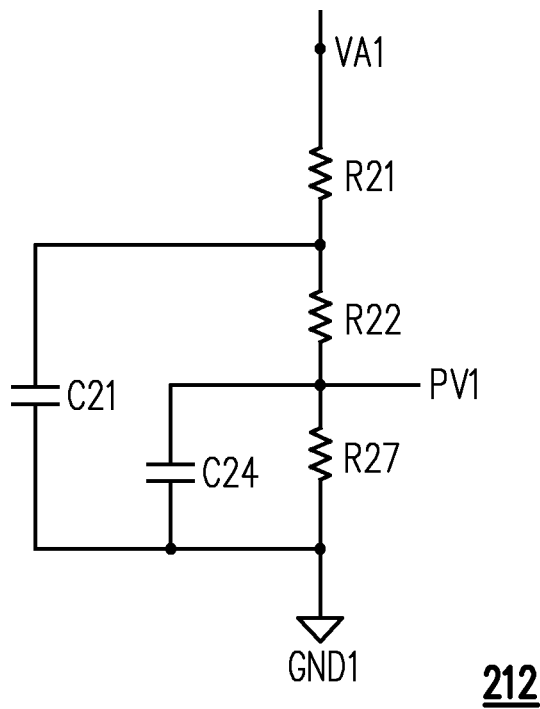
FIG. 3 is a schematic diagram of another implementation manner of a filter according to an embodiment of the present invention.

Referring to FIG. 3 below, FIG. 3 is a schematic diagram of another implementation manner of a filter according to an embodiment of the present invention. In FIG. 3, the filter 212 includes resistors R21, R22 and R27 and capacitors C21 and C24. The resistors R21, R22 and R27 are connected in series in sequence, the resistor R21 receives the quasi-direct current voltage VAL and the resistor R23 is coupled to the first reference grounding voltage end GND1. The capacitor C21 is coupled between a coupling point of the resistors R21 and R22 and the first reference grounding voltage end GND1, and the capacitor C24 is coupled between a coupling point of the resistors R22 and R27 and the first reference grounding voltage end GND1. In the present implementation manner, the filter 212 is a low-pass filtering circuit with two poles, and is configured for filtering out high-frequency noise more efficiently.

It should be noted that the implementation manners for the filter shown in FIG. 2 and FIG. 3 are only an example for illustration. In other embodiments of the present invention, the filter 212 of the present invention is implemented through a low-pass filtering circuit in any type, and there is no certain limitation.

Figure 4:
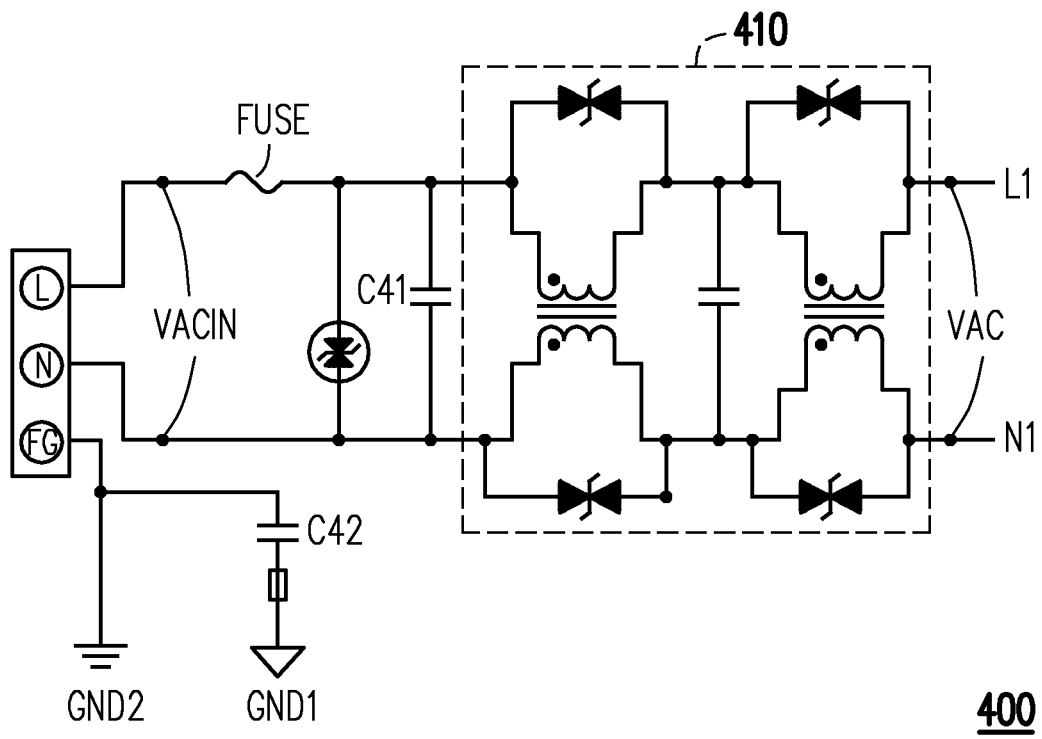
FIG. 4 is a schematic diagram of part of a circuit of a voltage detector according to an embodiment of the present invention.

Then referring to FIG. 4, FIG. 4 is a schematic diagram of part of a circuit of a voltage detector according to an embodiment of the present invention. In FIG. 4, in addition to a plurality of circuit elements as shown in FIG. 2, the voltage detector 400 further includes a FUSE, capacitors C41 and C42 and an electromagnetic interference filter (EMI filter)410. The FUSE is coupled between a live wire end L and the electromagnetic interference filter 410. The electromagnetic interference filter 410 is coupled between the live wire end L and a neutral wire end N, and the capacitor C41 is coupled to the electromagnetic interference filter 410 in parallel connection.

The electromagnetic interference filter 410 performs filtering on a received alternating current input voltage VACIN, and generates an alternating current input voltage VAC after being filtered through the live wire end L1 and the neutral wire end N1. In addition, in FIG. 4, a grounding end FG is directly connected to the second reference grounding voltage end GND2, and is coupled to the first reference grounding voltage end GND1 through the capacitor C42.

It should be noted that a circuit architecture of the electromagnetic interference filter 410 shown in FIG. 4 is only an example, electromagnetic interference filtering circuits known to those of ordinary skill in the art are all applied to the present invention, and there is no specific limitation.

Figure 5:
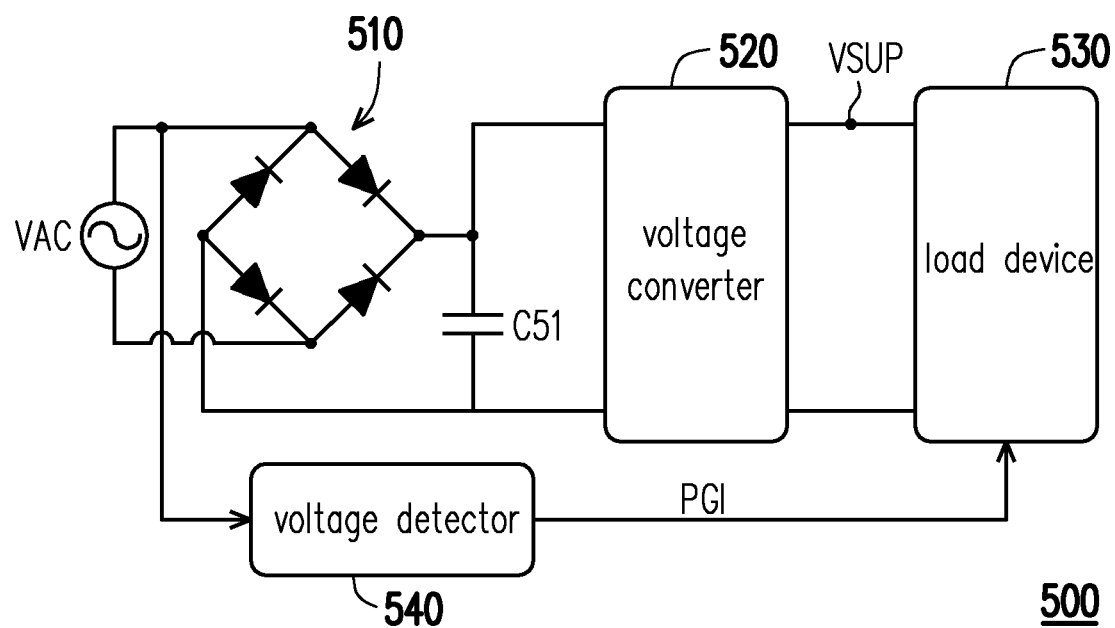
FIG. 5 is a schematic diagram of an electronic apparatus according to an embodiment of the present invention.

Referring to FIG. 5, FIG. 5 is a schematic diagram of an electronic apparatus according to an embodiment of the present invention. The electronic apparatus 500 includes a rectifying circuit 510, a voltage converter 520, a voltage detector 540 and a load device 530. The rectifying circuit 510 is a bridge type rectifying circuit, and receives an alternating current input voltage VAC. A capacitor C51 is a filtering capacitor and is coupled between the rectifying circuit 510 and the voltage converter 520 in parallel connection. The voltage converter 520 is a direct current to direct current voltage converter (DC to DC voltage converter), is configured for performing a voltage converting operation on a voltage provided by the capacitor C51, and generates a supply voltage VSUP.

The supply voltage VSUP is provided to the load device 530 to serve as an operating power source of the load device. In addition, the voltage detector 540 receives the alternating current input voltage VAC, and generates a detection signal PGI by detecting whether the alternating current input voltage VAC is powered off or not. The voltage detector 540 provides the detection signal PGI to the load device 530, and the load device 530 performs an adjusting operation of a power demand according to a voltage value of the detection signal PGI. Specifically speaking, when the alternating current input voltage VAC is powered off, the load device performs a load shedding operation according to the detection signal PGI, and the hold time provided by the capacitor C51 is prolonged.

Implementing details of the voltage detector 540 are illustrated in detail in the above-mentioned embodiments, and the descriptions thereof are omitted herein. About implementing details of the voltage converter 520, the voltage converter 520 is in any type, is the direct current to direct current voltage converter known to a person of ordinary skill in the art, and is not specifically limited.

Figure 6:
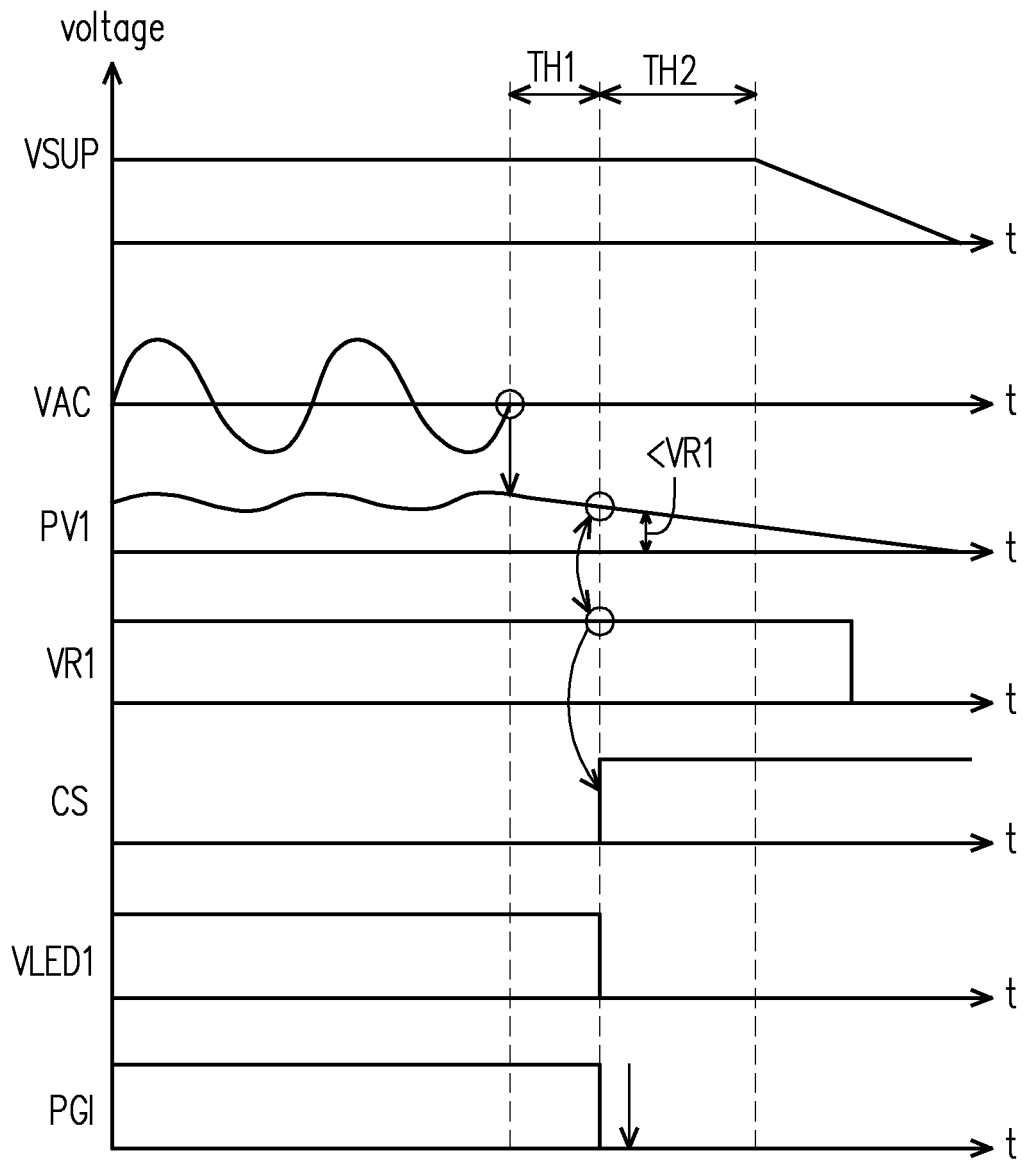
FIG. 6 is an operation waveform diagram of an electronic apparatus according to an embodiment of the present invention.

Referring to FIG. 2, FIG. 5 and FIG. 6 synchronously, FIG. 6 is an operation waveform diagram of an electronic apparatus according to an embodiment of the present invention. In FIG. 6, when the alternating current input voltage VAC is not powered off and a normal state is maintained, a voltage value of the correspondingly generated processed voltage PV1 is kept in a state to be greater than the reference voltage VR1, the voltage detector 200 correspondingly generates the comparison signal CS with the relatively low voltage, and a voltage difference VLED1 of two ends of the light-emitting element LED1 is enabled to be maintained at a high voltage value. Thus, the light-emitting element LED1 is maintained to send the induction signal IS, and the detection signal PGI is maintained at the relatively high voltage value.

When the alternating current input voltage VAC is powered off, the voltage value of the correspondingly generated processed voltage PV1 gradually decreases. After a hold time TH1 generated when the alternating current input voltage VAC is powered off, when the voltage value of the processed voltage PV1 is less than the reference voltage VR1, the voltage detector 200 correspondingly generates the comparison signal CS with the relatively high voltage. Through the comparison signal CS with the relatively high voltage, the voltage difference VLED1 of the two ends of the light-emitting element LED1 is lowered to the voltage value, and the induction signal IS is stopped from being sent. Thus, the phototransistor PT1 is turned off, and the detection signal PGI is lowered to the second reference grounding voltage.

Since the detection signal PGI, lowered to the second reference grounding voltage, is maintained at a relatively high voltage value, the load device 530 lowers the power demand, and after a hold time TH2, the voltage value of the supply voltage VSUP starts to decrease. It can be known that herein that through the voltage detector of the embodiments of the present invention, in the hold time TH1+TH2 after the alternating current input voltage VAC is powered off, the electronic apparatus 500 is maintained to operate, and under a condition that a power factor correction converter is not arranged, the hold time is effectively maintained.

It should be incidentally mentioned that in a waveform shown in FIG. 6, a horizontal axis is a time axis t, and a vertical axis is a voltage.

Figure 7:
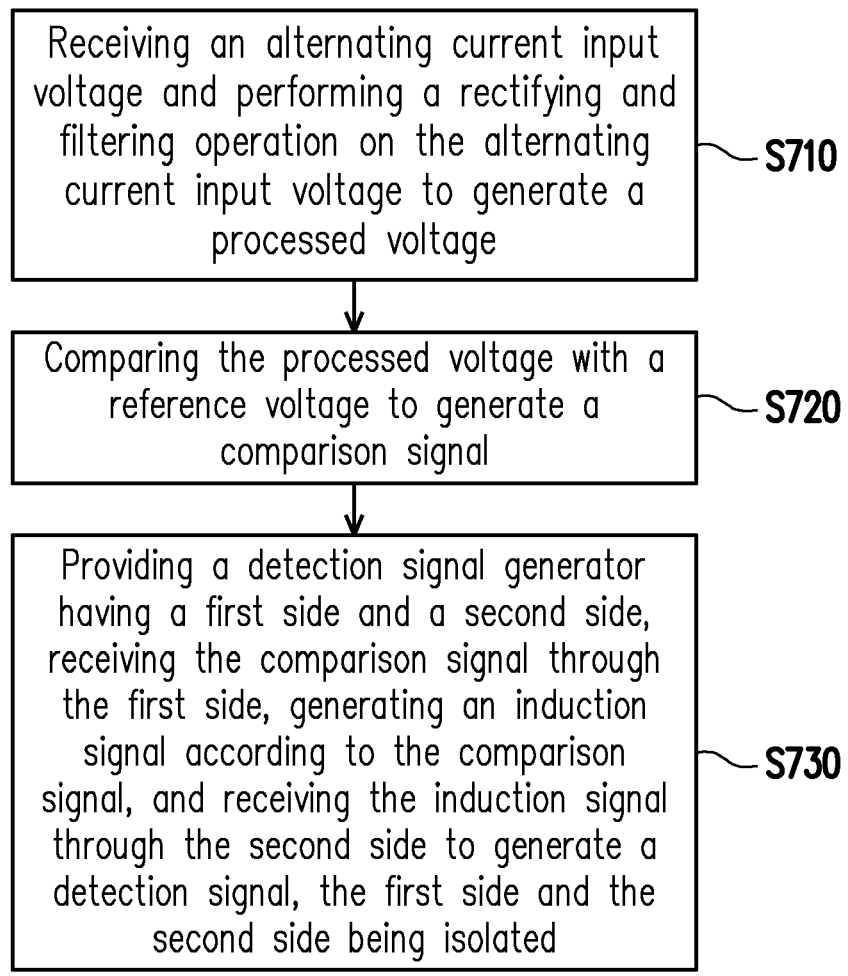
FIG. 7 is a flow chart of a voltage detection method according to an embodiment of the present invention.

Referring to FIG. 7 below, FIG. 7 is a flow chart of a voltage detection method according to an embodiment of the present invention. In step S710, an alternating current input voltage is received, and a rectifying and filtering operation is performed on the alternating current input voltage to generate a processed voltage. In step S720, the processed voltage is compared with a reference voltage to generate a comparison signal. In step S730, a detection signal generator having a first side and a second side is provided, the comparison signal is received through the first side and an induction signal is generated according to the comparison signal, and the induction signal is received through the second side to generate a detection signal. The first side and the second side are isolated.

Implementation details of the above-mentioned steps S710-S730 are illustrated in detail in the plurality of above-mentioned embodiments, and the descriptions thereof are omitted herein.

Based on the above, the present invention provides the voltage detector, the detection operation of the alternating current input voltage is performed in front of the first side, and the detection signal is provided to the load device on the second side. The load device is enabled to lower the power demand through adjustment according to whether the alternating current input voltage is powered off or not. On a premise that no need to arrange the power factor correction converter exists, the hold time is prolonged accordingly.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A voltage detector, comprising:
a rectifying and filtering circuit, receiving an alternating current input voltage, and performing a rectifying and filtering operation on the alternating current input voltage to generate a processed voltage;
a comparison circuit, coupled to the rectifying and filtering circuit, and comparing the processed voltage with a reference voltage to generate a comparison signal; and
a detection signal generator, having a first side and a second side, the first side coupled to the comparison circuit to receive the comparison signal, the first side generating an induction signal according to the comparison signal, and the second side receiving the indication signal to generate a detection signal,
wherein the first side and the second side are isolated,
wherein the detection signal generator comprises:
an optical coupler, having a light-emitting element and a phototransistor, wherein the light-emitting element is arranged on the first side, and the phototransistor is arranged on the second side; and
a first resistor, coupled between the phototransistor and a reference grounding voltage end,
wherein an end point, coupled to the phototransistor, of the first resistor generates the detection signal, a first end of the light-emitting element receives a power voltage, and a second end of the light-emitting element receives the comparison signal.

2. The voltage detector according to claim 1, wherein the comparison circuit comprises:
an operational amplifier, having a positive input end to receive the reference voltage and having a negative input end to receive the processed voltage, and an output end of the operational amplifier generating the comparison signal.

3. The voltage detector according to claim 1, further comprising:
a reference voltage generator, coupled to the comparison circuit and configured for providing the reference voltage.

4. The voltage detector according to claim 3, wherein the reference voltage is a Zener diode, an anode of the Zener diode is coupled to the reference grounding voltage end, and a cathode of the Zener diode receives the power voltage.

5. The voltage detector according to claim 1, wherein the light-emitting element generates the induction signal being optical energy when the comparison signal is a first reference grounding voltage, the phototransistor is turned on according to the induction signal, and the detection signal generator generates the detection signal being a first voltage.

6. The voltage detector according to claim 5, wherein the light-emitting element stops generating the induction signal and sets the phototransistor to be turned off when the comparison signal is a second voltage higher than the reference voltage, and the detection signal generator generates the detection signal being a second reference grounding voltage, wherein the first voltage is greater than the second reference grounding voltage.

7. The voltage detector according to claim 5, wherein the detection signal generator further comprises:
a second resistor, connected between the first resistor and the phototransistor in series; and
a third resistor, connected between the light-emitting element and the detection signal generator in series.

8. The voltage detector according to claim 1, wherein the rectifying and filtering circuit comprises:
a rectifying circuit, coupled to a live wire end and a neutral wire end to receive the alternating current input voltage and performing rectifying on the alternating current input voltage to generate a quasi-direct current voltage; and
a filtering circuit, coupled to the rectifying circuit, performing a low-pass filtering operation on the quasi-direct current voltage, and generating the processed voltage.

9. The voltage detector according to claim 8, wherein the rectifying circuit comprises:
a first diode, having an anode coupled to the live wire end; and
a second diode, having an anode coupled to the neutral wire end,
wherein cathodes of the first diode and the second diode are coupled to each other, and generate the quasi-direct current voltage.

10. The voltage detector according to claim 8, wherein the filtering circuit comprises:
a first resistor, having a first end to receive the quasi-direct current voltage;
a second resistor, having a first end coupled to a second end of the first resistor, and a second end of the second resistor coupled to the reference grounding voltage end; and
a first capacitor, coupled between the first end of the second resistor and the reference grounding voltage end.

11. The voltage detector according to claim 10, wherein the filtering circuit further comprises:
a third resistor, connected in a path where the second resistor is coupled to the reference grounding voltage end in series; and
a second capacitor, coupled between the second end of the second resistor and the reference grounding voltage end.

12. The voltage detector according to claim 1, further comprising:
an electromagnetic interference filter, coupled to a path where the rectifying and filtering circuit receives the alternating current input voltage.

13. An electronic apparatus, comprising:
the voltage detector according to claim 1; and
a load device, coupled to the voltage detector, the load device receiving the detection signal and adjusting a power demand according to the detection signal.

14. The electronic apparatus according to claim 13, wherein the load device lowers the power demand when the detection signal indicates that the alternating current input voltage is cut off.

15. The electronic apparatus according to claim 13, further comprising:
a rectifying circuit, receiving and rectifying the alternating current input voltage to generate a direct current input voltage; and
a voltage converter, coupled to the rectifying circuit, and executing a voltage converting operation on the direct current input voltage to generate a supply voltage,
wherein the supply voltage is sent to the load device to serve as an operating power source of the load device.

16. A voltage detection method, comprising:
receiving an alternating current input voltage, and performing a rectifying and filtering operation on the alternating current input voltage to generate a processed voltage;
comparing the processed voltage with a reference voltage to generate a comparison signal; and
providing a detection signal generator having a first side and a second side, receiving the comparison signal through the first side, generating an induction signal according to the comparison signal, and receiving the induction signal through the second side to generate a detection signal, wherein the first side and the second side are isolated,
wherein the step of providing the detection signal generator having the first side and the second side, receiving the comparison signal through the first side, generating the induction signal according to the comparison signal, and receiving the induction signal through the second side to generate the detection signal comprises:
providing an optical coupler having a light-emitting element and a phototransistor, and arranging the light-emitting element on the first side and the phototransistor on the second side; and
setting a first end of the light-emitting element to receive a power voltage and setting a second end of the light-emitting element to receive the comparison signal.

17. The voltage detection method according to claim 16, wherein the step of providing the detection signal generator having the first side and the second side, receiving the comparison signal through the first side, generating the induction signal according to the comparison signal, and receiving the induction signal through the second side to generate the detection signal further comprises:

setting the light-emitting element to generate the induction signal being optical energy when the comparison signal is a first reference grounding voltage, turning on the phototransistor according to the induction signal, and setting the detection signal generator to generate the detection signal being a first voltage; and setting the light-emitting element to stop generating the induction signal when the comparison signal is a second voltage higher than the reference voltage, setting the phototransistor being turned off, and setting the detection signal generator to generate the detection signal being a second reference grounding voltage, wherein the first voltage is greater than the second reference grounding voltage.

18. The voltage detection method according to claim 16, further comprising:

providing the detection signal for a load device and setting the load device to adjust a power demand according to the detection signal.

19. The voltage detection method according to claim 16, wherein the detection signal is configured for indicating whether the alternating current input voltage is cut off or not.

* * * * *